(12) United States Patent
Lee et al.

(10) Patent No.: US 8,288,645 B2
(45) Date of Patent: Oct. 16, 2012

(54) SINGLE HETEROJUNCTION BACK CONTACT SOLAR CELL

(75) Inventors: Jong-Jan Lee, Camas, WA (US); Paul J. Schuele, Washougal, WA (US); Steven R. Droes, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 711 days.

(21) Appl. No.: 12/405,962

(22) Filed: Mar. 17, 2009

(65) Prior Publication Data

US 2010/0236613 A1      Sep. 23, 2010

(51) Int. Cl.
*H01L 31/00* (2006.01)
*H01L 21/306* (2006.01)
(52) U.S. Cl. ........ 136/255; 136/252; 136/256; 136/258; 438/703; 257/E21.218; 257/E21.24
(58) Field of Classification Search .......... 136/252, 136/255, 258; 438/703; 257/E21.215, E21.218, 257/E21.24
See application file for complete search history.

(56) References Cited

U.S. PATENT DOCUMENTS

| | | | | |
|---|---|---|---|---|
| 7,339,110 | B1 * | 3/2008 | Mulligan et al. | 136/256 |
| 2002/0046765 | A1 * | 4/2002 | Uematsu et al. | 136/256 |
| 2004/0043528 | A1 * | 3/2004 | Kruhler | 438/57 |
| 2007/0256728 | A1 * | 11/2007 | Cousins | 136/252 |

OTHER PUBLICATIONS

Dirk-Holger Neuhaus and Adolf Munzer, "Industrial silicon wafer solar cells," Advances in OptoElectronics, vol. 2007, Article ID 24521.
Makoto Tanaka, Shingo Okamoto, Sadaji Tsuge and Seiichi Kiyama, Development of HIT solar cells with more than 21% conversion efficiency and commercialization of highest pe.
E. Conrad, K.V. Maydell, H. Angemann, C. Schubert, and M. Schmidt, "Optimization of interface properties in a-Si:H/c-Si heterojunction solar cells," 4th World Conference on.
Meijun Lu, Stuart Bowden, Ujjwal Das, and Robert Birkmier, "a-Si/c-Si heterojunction for interdigitated back contact solar cell," 22nd European Photovoltaic Solar Energy C.

* cited by examiner

*Primary Examiner* — Jennifer K. Michener
*Assistant Examiner* — Matthew Martin
(74) *Attorney, Agent, or Firm* — The Law Office of Gerald Maliszewski; Gerald Maliszewski

(57) ABSTRACT

A back contact single heterojunction solar cell and associated fabrication process are provided. A first semiconductor substrate is provided, lightly doped with a first dopant type. The substrate has a first energy bandgap. A second semiconductor is formed over a region of the substrate backside. The second semiconductor has a second energy bandgap, larger than the first energy bandgap. A third semiconductor layer is formed over the first semiconductor substrate topside, moderately doped with the first dopant and textured. An emitter is formed in the substrate backside, heavily doped with a second dopant type, opposite of the first dopant type, and a base is formed in the substrate backside, heavily doped with the first dopant type. Electrical contacts are made to the base and emitter. Either the emitter or base is formed in the second semiconductor.

16 Claims, 7 Drawing Sheets

SINGLE HETEROJUNCTION BACK CONTACT SOLAR CELL

BACKGROUND OF THE INVENTION

1. Field of the Invention

This invention generally relates to solar cell fabrication and, more particularly, to a single heterojunction back contact solar cell and associated fabrication process.

2. Description of the Related Art

FIG. 1 is a partial cross-sectional view of a conventional silicon solar cell (prior art). The starting silicon wafer is usually lightly boron (p) doped. The emitter layer is formed by phosphorous (n) diffusion on the wafer front surface, and the back surface field is formed by either boron diffusion or by silicon-aluminum (Si—Al) eutectic formation. The front surface has antireflection coating (ARC) and surface texturing to reduce the light reflection and improve the cell efficiency. The front grid contacts the emitter layer (n-doped region) and the back metal contacts the back surface field (p-doped) region. The limitations of this cell are (a) shading loss due to the metal grid;
(b) series resistance loss at the front metal grid and emitter resistance;
(c) front surface recombination loss at the emitter junction; and,
(d) rear surface recombination loss due to the low Al back surface passivation quality.

FIG. 2 is a partial cross-sectional view depicting a back contact solar cell (prior art). To reduce the front surface reflection loss and series resistance loss caused by the metal grid, the back contact solar cell was developed. For this cell, there is no shadowing effect, since there is no grid on the top surface. Series resistance is very low because the metal grid on the backside can be wide. Light trapping is improved because the front surface is decoupled from the electrical performance and only impacts the optical performance. Further, the cell has a simple electrical connection. A record cell efficiency of 23.4% has been reported. However, a high quality (single-crystal) silicon wafer is needed, so the photogenerated carriers can migrate to the wafer backside for collection. Single-crystal bulk silicon fabrication processes are expensive.

Although a high efficiency back contact cell has been reported, the open circuit voltage ($V_{OC}$) for this cell is still less than 0.7V. This voltage clearly indicates that the surface recombination at the emitter junction (n+ to p) and at the base junction (p+ to p) are still high. To increase the $V_{OC}$, it is necessary to reduce the surface recombination.

FIG. 3 is a perspective drawing depicting a heterojunction solar cell (prior art). It is generally agreed that heterojunctions create a minority carrier reflection mirror that can reduce the surface recombination and increase the $V_{OC}$. For Si solar cell, the hydrogenated amorphous silicon to crystalline silicon ($\alpha$-Si:H/c-Si) heterojunction of FIG. 3 has been extensively researched. $\alpha$-Si:H has larger bandgap (1.7-1.9 eV) than Si (1.1 eV), and the heterojunction has a discontinuity at the conduction band ($E_C$) and valance band ($E_V$). A cell efficiency of 22.3% has been reported. Compared to the back contact cell, the heterojunction cell has larger $V_{OC}$, but lower short circuit current ($I_{SC}$) and lower fill factor (FF). The lower $I_{SC}$ is caused by the shadowing effect of the metal grid at the front surface, and the lower FF is due to the grid resistance.

A heterojunction is the interface that occurs between two layers or regions of dissimilar semiconductors. These semiconducting materials have unequal band gaps. The engineering of electronic energy bands is also used in the design of semiconductor lasers and transistors. When a heterojunction is used as the base-emitter junction of a bipolar junction transistor, extremely high forward gain and low reverse gain result. This translates into very good high frequency operation (values in tens to hundreds of GHz) and low leakage currents. This device is called a heterojunction bipolar transistor (HBT).

The principle difference between a bipolar junction transistor (BJT) and the HBT is the use of differing semiconductor materials for the emitter and base regions, creating a heterojunction at the interface. The effect is to limit the injection of minority carriers into the emitter region and increase emitter efficiency, since the potential barrier in the valence band is so large at the heterojunction interface. Unlike BJT technology, this allows high doping to be used in the base, creating higher electron mobility while maintaining gain.

It is a common assumption that a solar cell that combines the advantages of back contact cell and heterojunction cell would have a higher efficiency than either one by itself. While several papers discuss a double heterojunction back contact solar cell, no simple and inexpensive means have been reported for integrating n-type $\alpha$-Si and p-type $\alpha$-Si on a single side of a solar cell.

Additionally, an anomalous "S" shaped I-V characteristic is often observed for Si double heterojunction back contact cells fabricated both on p- and n-type c-Si wafers. This "S" shaped I-V characteristic has been attributed to various mechanisms including carrier recombination at the interface defects, recombination in the c-Si depletion region, offset in valence band, and offset in conduction band. The band offset may impose potential barriers for transport of photogenerated carriers across the heterojunction, thereby affecting the fill factor.

It would be advantageous if a solar cell could be efficiently fabricated that included the advantages of both a heterojunction and back contacts.

SUMMARY OF THE INVENTION

Disclosed herein is a single heterojunction back contact solar cell. The heterojunction is formed at only one junction: either at the emitter junction or at the base junction. The other junction is formed using conventional dopant diffusion. Although the $V_{OC}$ for this structure is not as high as that of the double heterojunction solar cell, it has lower manufacturing cost than the double heterojunction back contact cell, and has higher efficiency than the conventional back contact cell. In addition, the anomalous "S" shaped I-V characteristic associated with the double heterojunction back contact cell is eliminated.

For example, the single heterojunction back contact cell may be fabricated on an n-type single crystal silicon (c-Si) wafer with an n+ amorphous Si ($\alpha$-Si) used to form the heterojunction to c-Si at the base junction. The general consensus concerning the a-Si to c-Si heterojunction is that the valence band offset is lager than the conduction band offset. Unlike the double heterojunction cell, where both junctions hinder the minority carrier hole movement, the cell with the single heterojunction at the base only hinders the hole movement toward the base (n+) direction. This effectively reduces the carrier recombination at the base junction. The minority carriers (holes) can be collected by the emitter (p+) without "seeing" the potential barrier. Therefore, the "S" shaped I-V characteristic is eliminated.

Accordingly, a method is provided for fabricating a back contact single heterojunction solar cell. A first semiconductor substrate is provided, lightly doped with a first (e.g., n) dopant type. The substrate has a topside, a backside, and a first energy bandgap. A second semiconductor is formed over a region of the substrate backside. The second semiconductor has a second energy bandgap, larger than the first energy bandgap. A third semiconductor layer is formed over the first semiconductor substrate topside, moderately doped with the first dopant and textured. An emitter is formed in the substrate backside, heavily doped with a second (e.g., p) dopant type, opposite of the first dopant type, and a base is formed in the substrate backside, heavily doped with the first dopant type. Electrical contacts are made to the base and emitter. Either the emitter or base is formed in the second semiconductor.

For example, a region of the substrate backside may be heavily doped with the first dopant and the second semiconductor is deposited, in-situ doped with the second dopant. Then, the emitter is formed in the second semiconductor and the base is formed in the heavily doped region of the substrate backside. Alternately, a region of the substrate backside is heavily doped with the second dopant and the second semiconductor is deposited in-situ doped with the first dopant. Then, the base is formed in the second semiconductor and the emitter is formed in the heavily doped region of the substrate backside.

Additional details of the above-described method and back contact single hetero-emitter junction solar cell are provided below.

DETAILED DESCRIPTION

Figure 1:
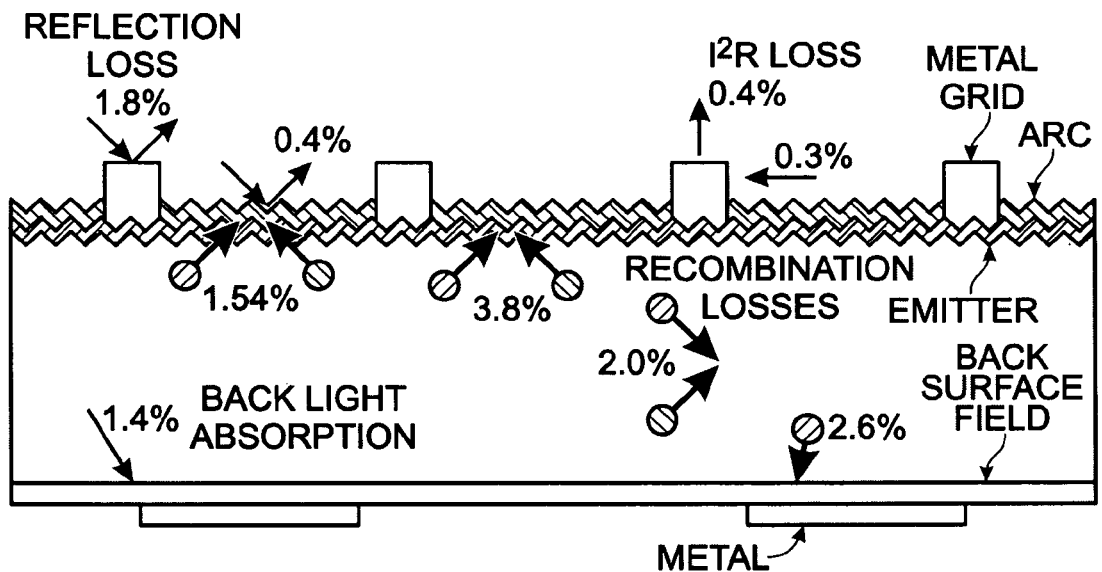
FIG. 1 is a partial cross-sectional view of a conventional silicon solar cell (prior art).
Figure 2:
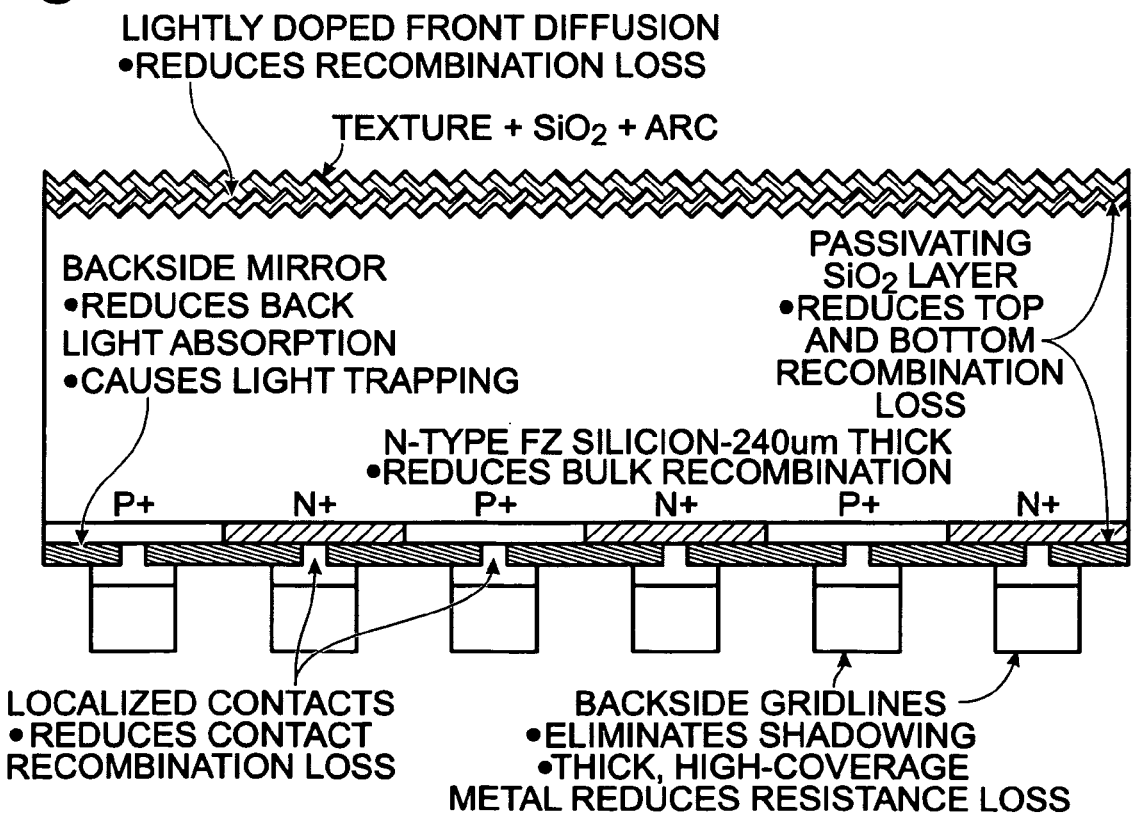
FIG. 2 is a partial cross-sectional view depicting a back contact solar cell (prior art).
Figure 3:
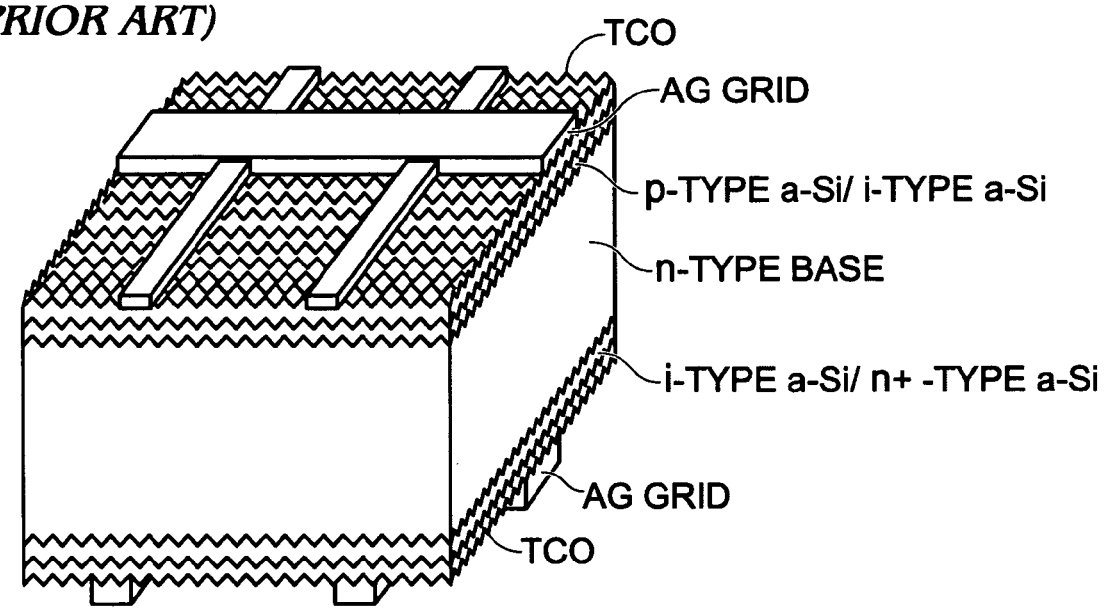
FIG. 3 is a perspective drawing depicting a heterojunction solar cell (prior art).
Figure 4:
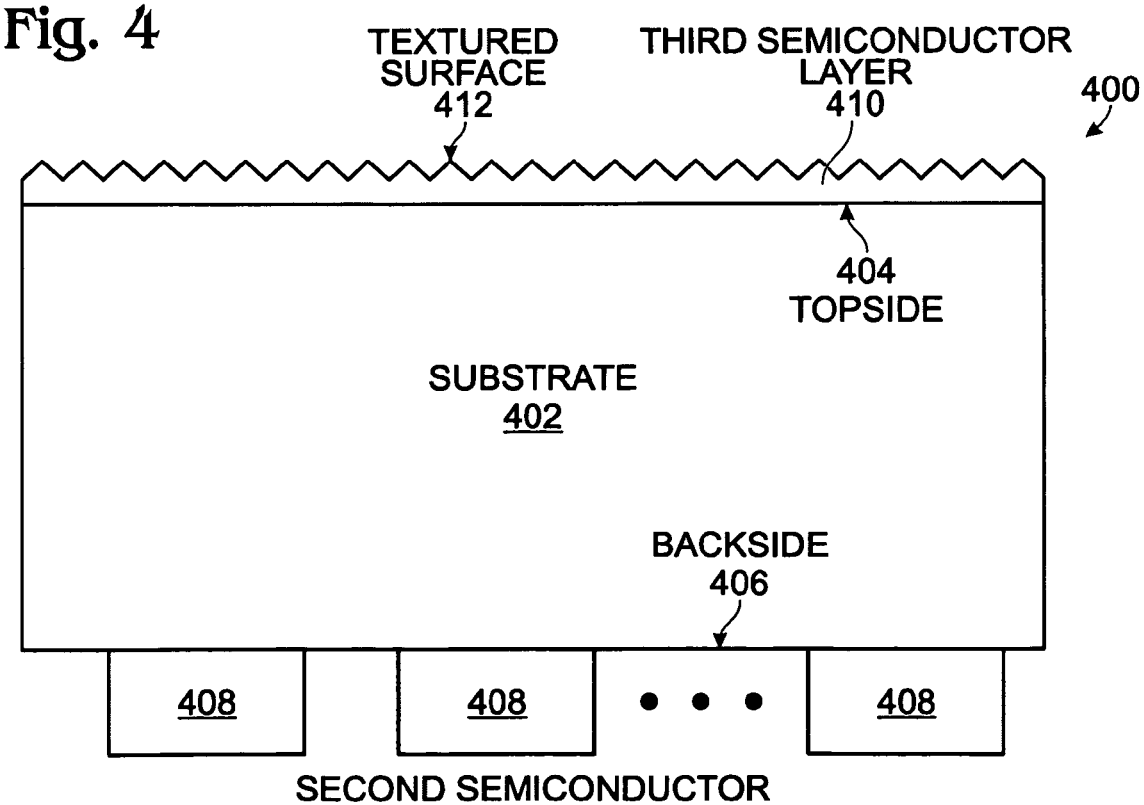
FIG. 4 is a partial cross-sectional view of a back contact single heterojunction solar cell.

FIG. 4 is a partial cross-sectional view of a back contact single heterojunction solar cell. The solar cell 400 comprises a first semiconductor substrate 402 lightly doped with a first dopant type. The substrate 402 has a topside 404, a backside 406, and a first energy bandgap (associated with the choice of material and the doping). A second semiconductor film 408 overlies a region of the substrate backside 406. The second semiconductor 408 has a second energy bandgap, larger than the first energy bandgap. A third semiconductor layer 410 has a textured top surface 412, overlying the first semiconductor substrate topside, and is moderately doped with the first dopant.

Either the emitter or the base is formed in the second semiconductor film 408. If the emitter is formed in the second semiconductor layer (as in FIG. 5B), then the base is formed in the substrate. Alternately (as shown in FIG. 5A), if the base is formed in the second semiconductor film 408, the emitter is formed in the substrate.

Figure 5A:
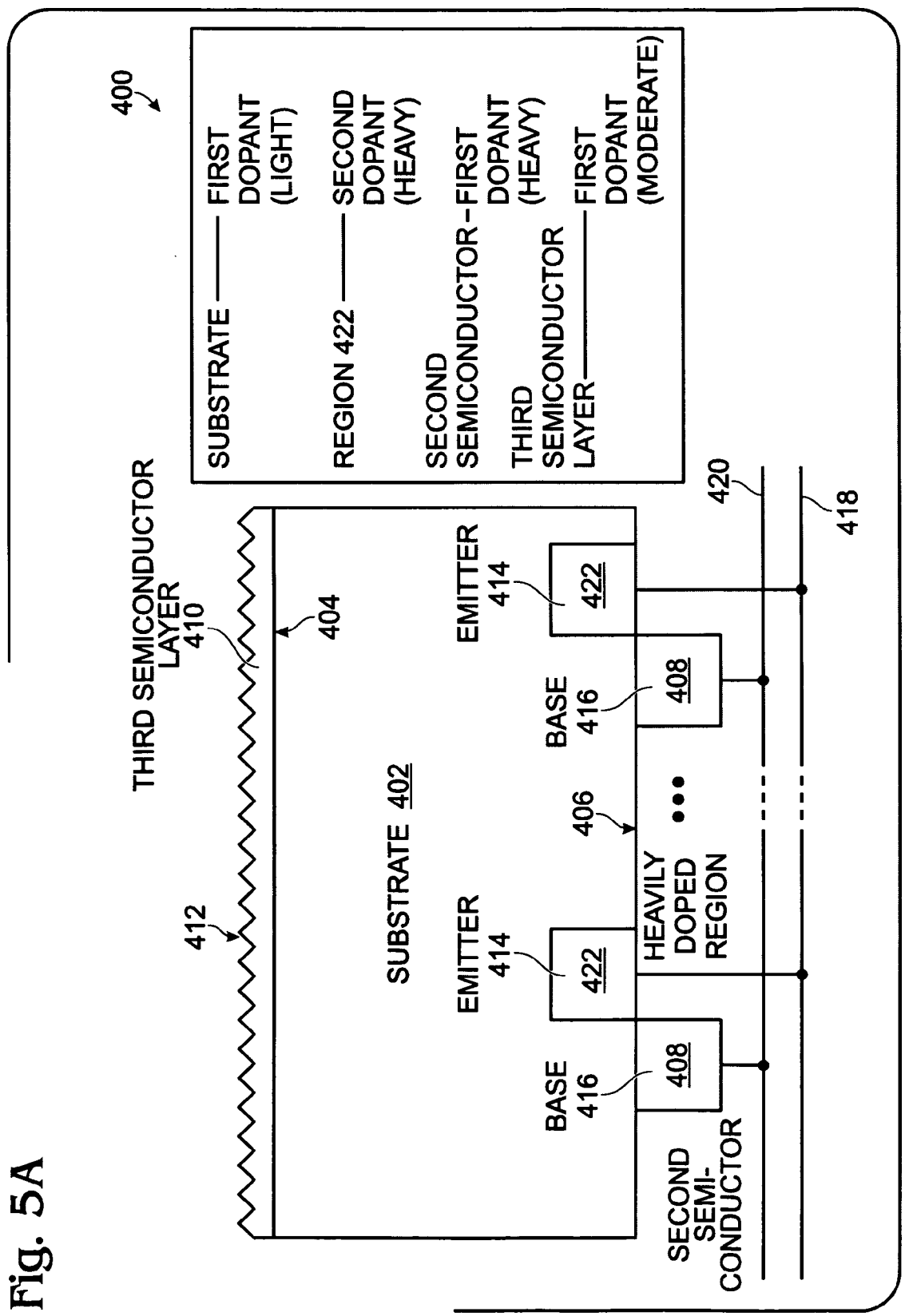
FIGS. 5A and 5B are partial cross-sectional views depicting specific embodiments of the back contact single heterojunction solar cell of FIG. 4.
Figure 5B:
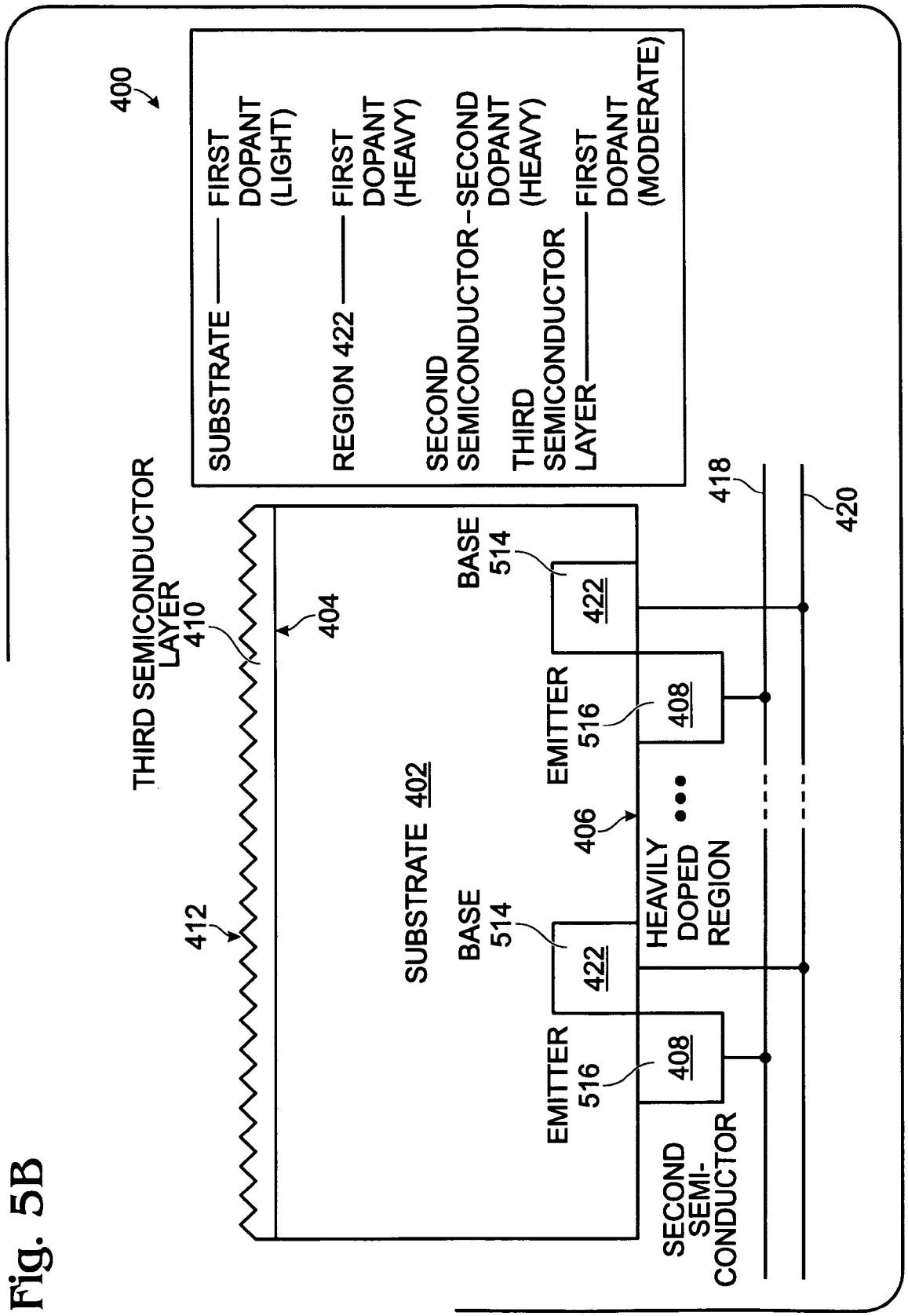

FIGS. 5A and 5B are partial cross-sectional views depicting specific embodiments of the back contact single heterojunction solar cell of FIG. 4. In FIG. 5A an emitter 414 is formed in the substrate backside 406 heavily doped with a second dopant type, opposite of the first dopant type. A base 416 in the substrate backside 406 is heavily doped with the first dopant type. A first electrical contact 418 is formed to the emitter 414 and a second electrical contact 420 is formed to the base 416. More explicitly, the substrate backside 406 includes a region 422 heavily doped with the second dopant and the second semiconductor film 408 is heavily doped with the first dopant. The base 416 is formed in the second semiconductor 408, and the emitter 414 is formed in the heavily doped region 422 of the substrate backside.

In one aspect, the first dopant is an n-type dopant material (e.g., phosphorous) and the second dopant is a p-type dopant material (e.g., boron). Alternately, the first dopant is p-type and the second dopant is n-type. For example, the first semiconductor substrate 402 is a lightly n-doped silicon substrate and the base 416 is a heavily n-doped amorphous silicon second semiconductor material.

As used herein, a heavily doped region, e.g., a heavily p doped region, is referred to as p+(p+ doped), and is associated with dopant concentrations in the range of about $1 \times 10^{19}$ to $1 \times 10^{21}$ $cm^{-3}$. Regions with this degree of dopant are often contact areas. A moderately doped region, e.g., a moderately p doped region, is referred to as p (p doped or p-doped), and is associated with dopant concentrations in the range of about $5 \times 10^{16}$ to $1 \times 10^{19}$ $cm^{-3}$. A lightly doped region, e.g., a lightly p doped region, is referred to as p− (p− doped), and is associated with dopant concentrations in the range of about $1 \times 10^{15}$ to $5 \times 10^{16}$ $cm^{-3}$. For the n-type layers, the doping concentrations are the same as for p-type dopants, as stated above. The term "n-type" refers to any amount of n doping. Likewise, "p-type" refers to any level of p doping.

In FIG. 5B the substrate backside 406 includes a region 422 heavily doped with the first dopant and the second semiconductor film 408 is heavily doped with the second dopant. The emitter 516 is formed in the second semiconductor film 408 and the base 514 is formed in the heavily doped region 422 of the substrate backside. In one aspect, the first dopant is an n-type material (e.g., phosphorous) and the second dopant is a p-type material (e.g., boron). Alternately, the first dopant is p-type and the second dopant is n-type.

Referencing either FIG. 5A or FIG. 5B, the first semiconductor substrate 402 may be a material such as single crystalline silicon, multicrystalline silicon, polycrystalline silicon, amorphous silicon, single crystalline silicon-germanium, or III-V compound semiconductors. The second semiconductor film 408 and third semiconductor layer 410 may each be a material such as hydrogenated amorphous silicon, hydrogenated amorphous silicon carbide, hydrogenated amorphous silicon germanium, hydrogenated microcrystalline silicon oxide, microcrystalline silicon, III-V compound semiconductors, II-VI compound semiconductors, or organic semiconductors. The material used for the second and third semiconductors need not necessarily be the same material.

In one aspect the third semiconductor layer 410 may be deposited over the first substrate topside 404, in which case the first substrate 402 and third semiconductor layer may be different materials. More explicitly, the third semiconductor layer 410 may be a separate semiconductor layer, moderately doped with the first dopant, deposited over the first semiconductor substrate topside 404. Alternately, the third semiconductor layer 410 may be a moderately doped region topside region 404 of the first semiconductor substrate 402, in which case the third semiconductor layer 410 is the same material as the substrate 402.

Functional Description

FIGS. 6A through 6I depict steps in an exemplary single heterojunction back contact solar cell fabrication process. The device can be completed by four alignment processes. However, it should be understood that the same, or a similar device can be made using an alternate process flow.

Figure 6A:
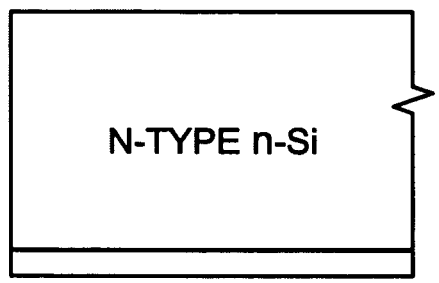
FIGS. 6A through 6I depict steps in an exemplary single heterojunction back contact solar cell fabrication process.

In FIG. 6A the process starts with either a lightly doped n-type or p-type substrate. An n-type silicon substrate is used in this example. If p-type silicon is used, the dopant in the following process changes to opposite polarity (n to p, p to n). The silicon can be either single crystalline or multi-crystalline with thickness of 50 microns (μm) to 400 μm. The phosphorous dopant density is between 5E14 to 5E15 $cm^{-3}$. Thermal oxide is grown on the wafer backside.

Figure 6B:
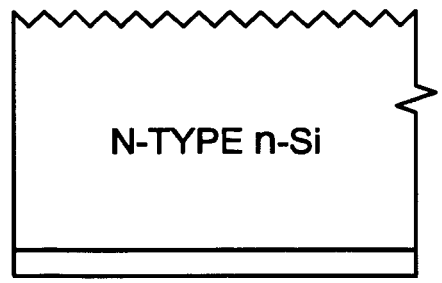

In FIG. 6B single side texturing is performed. An alkaline etchant, such as NaOH and KOH, may be used in the process, resulting in the formation of a pyramidal etch structure.

Figure 6C:
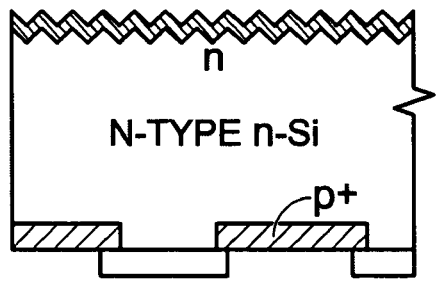
Figure 6D:
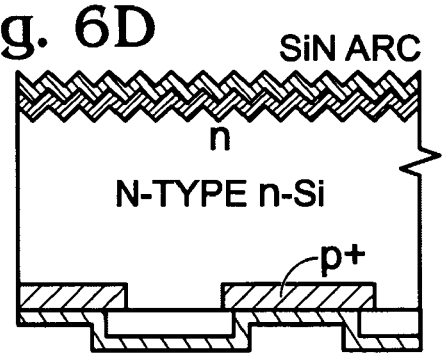

In FIG. 6C, phosphorous is diffused into the front side surface to form the front surface field. The doping process may be done in diffusion furnace with $POCl_3$ as diffusion gas. Backside oxide windows are opened for the emitter doping for the case of the heterojunction being formed at the base junction. The oxide can be removed by laser ablation or by wet etch. The oxide width is between 200 μm to 1000 μm and the opening is between 500 μm to 2000 μm. The ratio of base junction to emitter junction is between 1:1.5 and 1:3. In FIG. 6D $SiN_X$ is deposited on both sides of the substrate. The $SiN_X$ on the front side is used as anti-reflecting coating, and the one on the backside is used as hard mask.

Figure 6E:
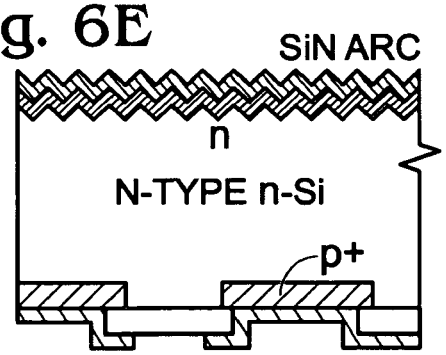

In FIG. 6E the $SiN_X$ is selectively etched on the wafer backside. This opening is for the base junction formation. The $SiN_X$ can be removed by laser ablation or by wet etch.

Figure 6F:
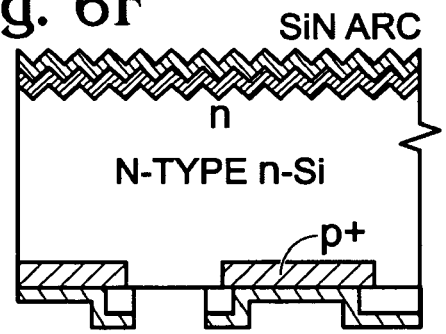

In FIG. 6F the oxide is selectively wet etched, using the $SiN_X$ as a mask.

Figure 6G:
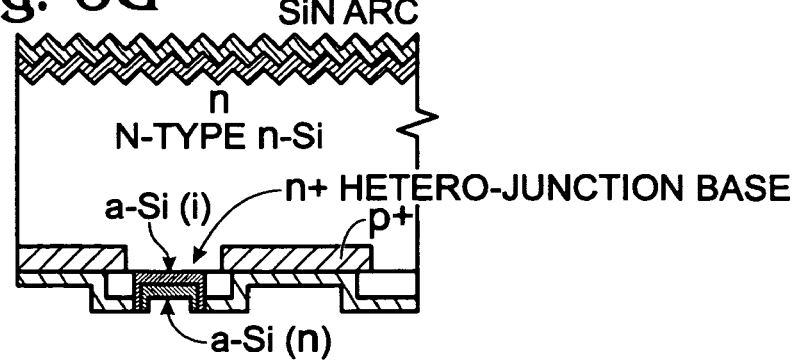

In FIG. 6G α-Si:H is deposited on the wafer backside. Optionally (as shown), an intrinsic (undoped) a-Si:H layer is formed between the n+ a-Si:H and the silicon substrate. The intrinsic α-Si:H layer thickness is between 0 to 10 nm, whereas the n-type phosphorous doped α-Si:H layer thickness is between 5 nm to 50 nm. Note that the dopant in the a-Si is by in-situ doping. For example, PH3 for n-type phosphorous doping or B2H6 for p-type boron doping is mixed in CVD. No extra implantation is needed. The 0 nm i-layer implies that the intrinsic layer is optional. Then the α-Si:H is selectively etched. The process can be done by laser ablation or by dry etching with an etching mask. The a:Si:H layer can be doped with C or O to increase the bandgap. The resulting film can be represented as α-SiC:H and α-SiO:H, respectively.

An alternative flow is to deposit an electrode on top of a-Si:H (n) before the a-Si:H selective etch. The electrode can be a transparent conducting oxide (e.g., TCO, ITO, SnO2:F, or ZnO) or any suitable metal electrode (e.g., Ag, Al, Ti, Ta, etc.) that is able to make a good contact to the a-Si:H. The conductor and the a-Si:H are then selective etched to form the depicted structure.

Figure 6H:
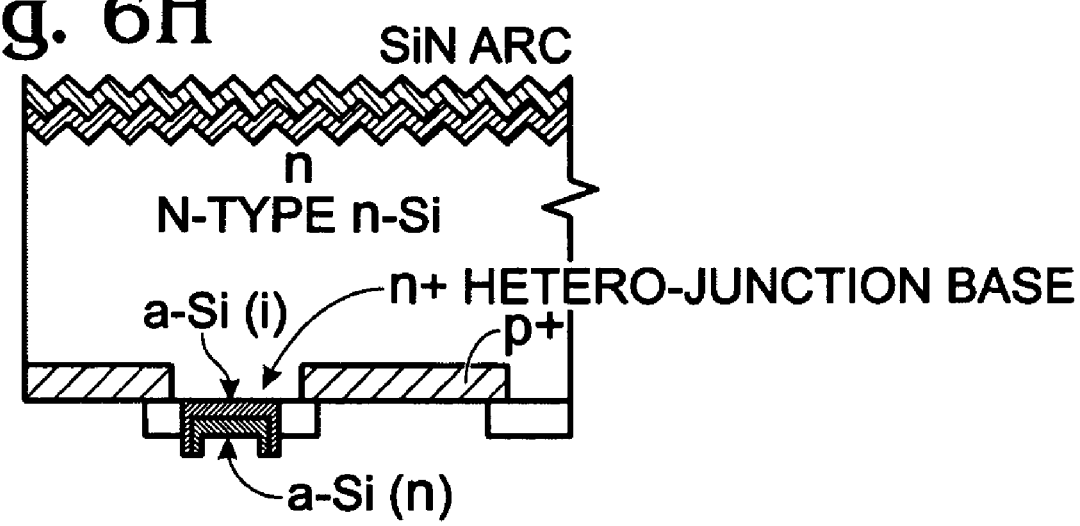

In FIG. 6H the $SiN_X$ is selectively removed on the wafer backside, using a wet etch for example.

Figure 6I:
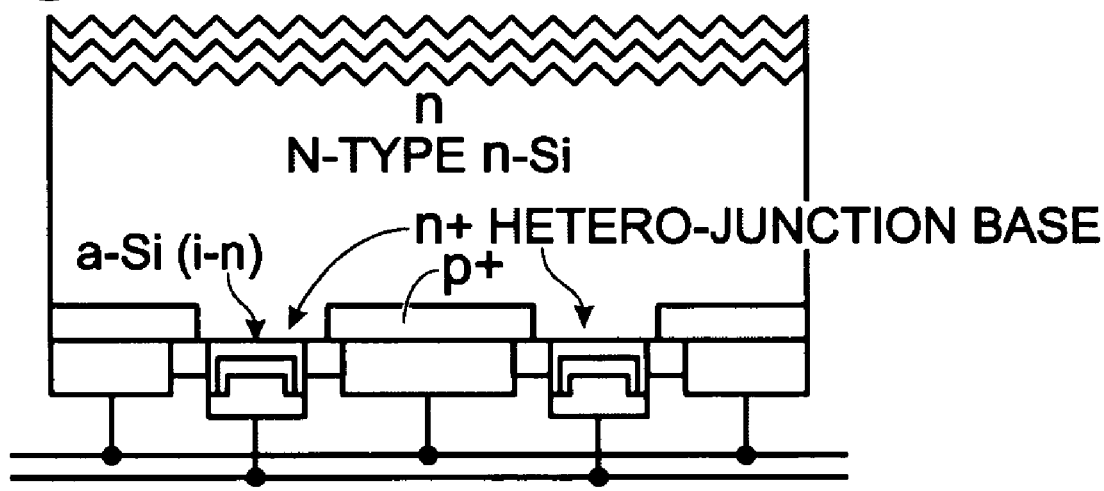

In FIG. 6I metal is deposited and pattered to form the emitter contact and the base contact.

Figure 7:
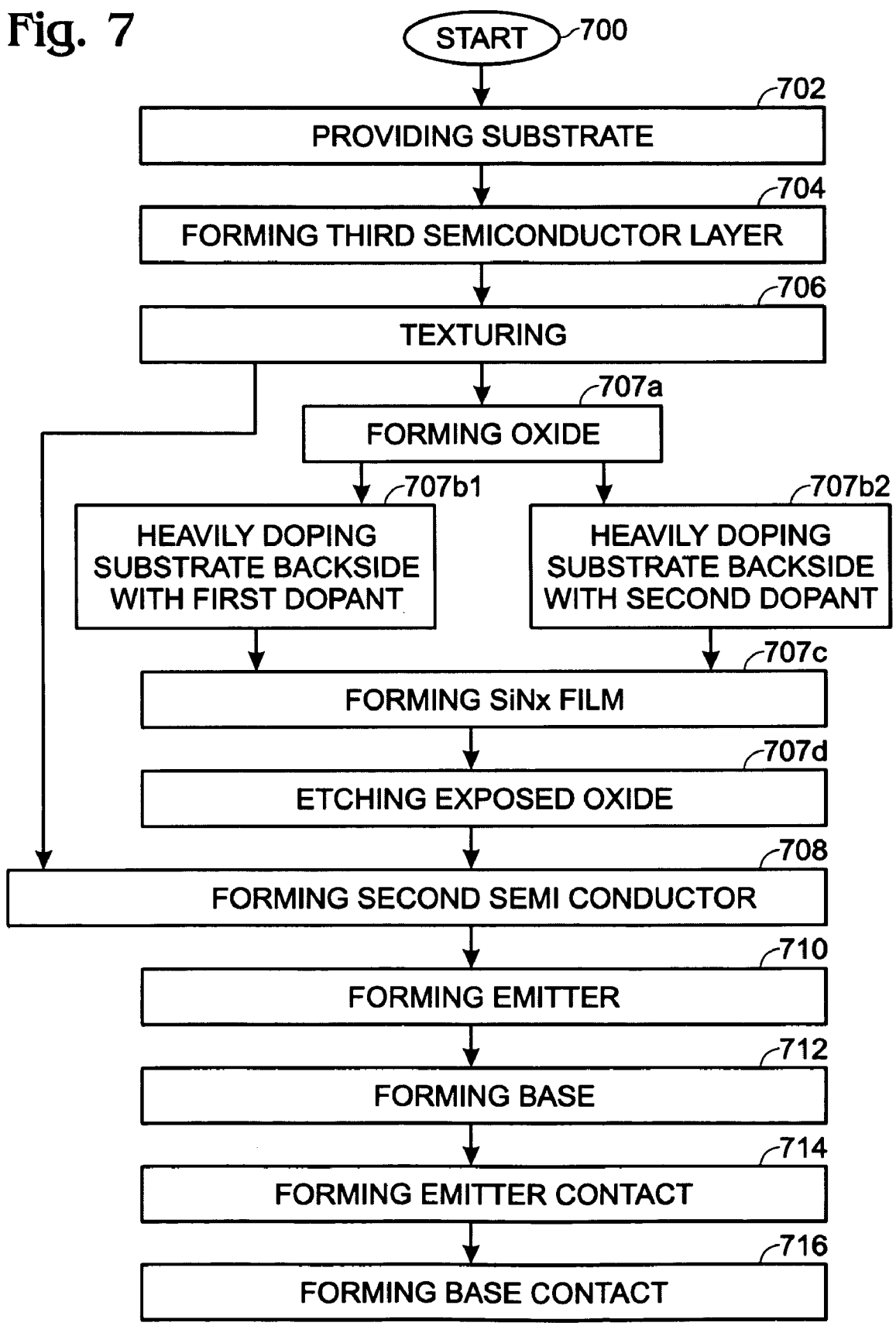
FIG. 7 is a flowchart illustrating a method for fabricating a back contact single heterojunction solar cell.

FIG. 7 is a flowchart illustrating a method for fabricating a back contact single heterojunction solar cell. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 700.

Step 702 provides a first semiconductor substrate lightly doped with a first dopant type, the substrate having a topside, a backside, and a first energy bandgap. The first semiconductor substrate can be a material such as single crystalline silicon, multicrystalline silicon, polycrystalline silicon, amorphous silicon, single crystalline silicon-germanium, or III-V compound semiconductors. Step 704 forms a third semiconductor layer overlying the first semiconductor substrate topside, moderately doped with the first dopant. In one aspect, Step 704 deposits the third semiconductor layer, moderately doped with the first dopant, overlying the first semiconductor substrate topside. Alternately, the topside of the first semiconductor substrate is (moderately) doped. The second semiconductor and third semiconductor layer may each be a material such as hydrogenated amorphous silicon, hydrogenated amorphous silicon carbide, hydrogenated amorphous silicon germanium, hydrogenated microcrystalline silicon oxide, microcrystalline silicon, III-V compound semiconductors, II-VI compound semiconductors, or organic semiconductors. There is no requirement that the second and third semiconductors be the same material. Step 706 textures the top surface of the third semiconductor layer.

Step 708 forms a second semiconductor overlying a region of the substrate backside. The second semiconductor has a second energy bandgap, larger than the first energy bandgap. The second semiconductor may be deposited using one of the following processes: chemical vapor deposition (CVD), plasma enhanced chemical vapor deposition (PECVD), hot wire chemical vapor deposition (HWCVD), high frequency plasma enhanced chemical vapor deposition (HFPECVD), high density plasma enhanced chemical vapor deposition (HDPECVD), inkjet printing, or screen printing. Note: Step 708 may be performed before Step 704 in some aspects of the method. In another aspect, if the second and third semiconductor materials are the same, Steps 704 and 708 may be performed simultaneously.

Step 710 forms an emitter in the substrate backside, heavily doped with a second dopant type, opposite of the first dopant type. Step 712 forms a base in the substrate backside, heavily doped with the first dopant type. Step 714 forms a first electrical contact to the emitter. Step 716 forms a second electrical contact to the base. If Step 710 forms the emitter in the second semiconductor, then Step 712 forms the base in the substrate backside. If Step 710 forms the emitter in the substrate backside, Step 712 forms the base in the second semiconductor.

More explicitly, Step 707b1 heavily dopes a region of the substrate backside with the first dopant, and forming the second semiconductor in Step 708 includes depositing a second semiconductor in-situ doped with the second dopant. Then, forming the emitter in Step 710 includes forming the emitter in the second semiconductor, and forming the base in Step 712 includes forming the base in the heavily doped region of the substrate backside.

Alternately, Step 707b2 heavily dopes a region of the substrate backside with the second dopant, and forming the second semiconductor in Step 708 includes depositing a second semiconductor in-situ doped with the first dopant. Then, forming the base in Step 712 includes forming the base in the second semiconductor, and forming the emitter in Step 710 includes forming the emitter in the heavily doped region of the substrate backside.

In one aspect, Step 707a selectively forms thermal oxide overlying the substrate backside, and Steps 707b1 and 707b2 heavily dope regions of the substrate backside exposed through openings in the thermal oxide. Step 707*c* forms a SiNx film overlying the substrate top surface and the heavily dopes regions of the substrate backside. Step 707*d* etches exposed regions of thermal oxide. Then, Step 708 deposits the second semiconductor through the etched openings in the thermal oxide overlying the substrate backside.

In one aspect, Step 702 provides an n-doped silicon substrate, and Step 712 forms an n+ doped base in an amorphous silicon second semiconductor material, see FIG. 6I.

A back contact single heterojunction solar cell and associated fabrication process have been presented. Specific structures, materials, and processes have been given to illustrate the invention. However, the invention is not limited to merely these examples. Other variations and embodiments of the invention will occur to those skilled in the art.

We claim:

1. A method for fabricating a single heterojunction solar cell, the method comprising:
   providing a first semiconductor substrate lightly doped with a first dopant type, the substrate having a topside, a backside, and a first energy bandgap;
   forming a second semiconductor overlying a region of the substrate backside, the second semiconductor having a second energy handgap, larger than the first energy handgap;
   forming a third semiconductor layer overlying the first semiconductor substrate topside, moderately doped with the first dopant;
   texturing a top surface of the third semiconductor layer;
   forming a single heterojunction as follows:
      forming a first electrode element selected from a group consisting of an emitter and a base in the substrate backside, where the emitter is heavily doped with a second dopant type, opposite of the first dopant type, and where the base in heavily doped with the first dopant;
      forming a second electrode element selected from the group consisting of the base and the emitter in the second semiconductor, wherein the second electrode element consists of the base or emitter unselected in the first electrode;
   forming a first electrical contact to the emitter; and,
   forming a second electrical contact to the base.

2. The method of claim 1 wherein providing the first semiconductor substrate includes providing a substrate material selected from a group consisting of single crystalline silicon, multicrystalline silicon, polycrystalline silicon, amorphous silicon, single crystalline silicon-germanium, and III-V compound semiconductors.

3. The method of claim 1 wherein forming the second semiconductor and third semiconductor layer includes forming each with a material selected from a group consisting of hydrogenated amorphous silicon, hydrogenated amorphous silicon carbide, hydrogenated amorphous silicon germanium, hydrogenated microcrystalline silicon oxide, microcrystalline silicon, III-V compound semiconductors, II-VI compound semiconductors, and organic semiconductors.

4. The method of claim 1 further comprising:
   heavily doping a region of the substrate backside with the first dopant;
   wherein forming the second semiconductor includes depositing a second semiconductor in-situ doped with the second dopant;
   wherein forming the emitter includes forming the emitter in the second semiconductor; and,
   wherein forming the base includes forming the base in the heavily doped region of the substrate backside.

5. The method of claim 1 further comprising:
   heavily doping a region of the substrate backside with the second dopant;
   wherein forming the second semiconductor includes depositing a second semiconductor in-situ doped with the first dopant;
   wherein forming the base includes forming the base in the second semiconductor; and,
   wherein forming the emitter includes forming the emitter in the heavily doped region of the substrate backside.

6. The method of claim 1 wherein forming the second semiconductor includes depositing a second semiconductor using a process selected from a group consisting of chemical vapor deposition (CAM), plasma enhanced chemical vapor deposition (PECVD), hot wire chemical vapor deposition (HWCVD), high frequency plasma enhanced chemical vapor deposition (HFPECVD), high density plasma enhanced chemical vapor deposition (HDPECVD), inkjet printing, and screen printing.

7. The method of claim 1 further comprising:
   selectively forming thermal oxide overlying the substrate backside;
   heavily doping regions of the substrate backside exposed through openings inn the thermal oxide;
   forming a SiNx film overlying the substrate top surface and the heavily doped regions of the substrate backside;
   etching exposed regions of thermal oxide;
   depositing the second semiconductor through the etched openings in the thermal oxide overlying the substrate backside.

8. The method of claim 1 wherein forming the third semiconductor layer includes forming the third semiconductor layer selected from a group consisting of depositing a third semiconductor layer, moderately doped with the first dopant, overlying the first semiconductor substrate topside, and doping the topside of the first semiconductor substrate.

9. The method of claim 1 wherein providing the first semiconductor substrate lightly doped with the first dopant type includes providing an n-doped silicon substrate; and,
   wherein forming the base in the substrate backside, heavily doped with the first dopant type, includes forming an n+ doped base in an amorphous silicon second semiconductor material.

10. A single heterojunction solar cell, the solar cell comprising:
   a first semiconductor substrate lightly doped with a first dopant type, the substrate having a topside, a backside, and a first energy bandgap;
   a second semiconductor film overlying a region of the substrate backside, the second semiconductor having a second energy bandgap, larger than the first energy bandgap;
   a third semiconductor layer with a textured top surface, overlying the first semiconductor substrate topside, moderately doped with the first dopant;
   a single heterojunction comprising:
      a first electrode element selected from a group consisting of an emitter and a base formed in the substrate backside, where the emitter is heavily doped with a second dopant type, opposite of the first dopant type, and where the base is heavily doped with the first dopant;
      a second electrode element selected from the group consisting of the base and the emitter in the second semiconductor, wherein the second electrode element consists of the base or emitter unselected in the first electrode;

a first electrical contact to the emitter; and, a second electrical contact to the base.

11. The solar cell of claim 10 wherein the first semiconductor substrate is material selected from a group consisting of single crystalline silicon, multicrystalline silicon, polycrystalline silicon, amorphous silicon, single crystalline silicon-germanium, and III-V compound semiconductors.

12. The solar cell of claim 10 wherein the second semiconductor film and third semiconductor layer are each a material selected from a group consisting of hydrogenated amorphous silicon, hydrogenated amorphous silicon carbide, hydrogenated amorphous silicon germanium, hydrogenated microcrystalline silicon oxide, microcrystalline silicon, III-V compound semiconductors, II-VI compound semiconductors, and organic semiconductors.

13. The solar cell of claim 10 wherein the substrate backside includes a region heavily doped with the first dopant;

wherein the second semiconductor film is heavily doped with the second dopant;

wherein the emitter is formed in the second semiconductor film; and, wherein the base is formed in the heavily doped region of the substrate backside.

14. The solar cell of claim 10 wherein the substrate backside includes a region heavily doped with the second dopant;

wherein the second semiconductor film is heavily doped with the first dopant;

wherein the base is formed in the second semiconductor; and, wherein the emitter is formed in the heavily doped region of the substrate backside.

15. The solar cell of claim 10 wherein the third semiconductor layer is selected from a group consisting of a separate semiconductor layer, moderately doped with the first dopant, deposited over the first semiconductor substrate topside, and a moderately doped region topside region of the first semiconductor substrate.

16. The solar cell of claim 10 wherein the first semiconductor substrate is a lightly n-doped silicon substrate; and, wherein the base is a heavily n+ doped amorphous silicon second semiconductor material.

* * * * *